(12) United States Patent
Voshell et al.

(10) Patent No.: US 6,751,117 B2
(45) Date of Patent: Jun. 15, 2004

(54) SINGLE ENDED ROW SELECT FOR A MRAM DEVICE

(75) Inventors: Tom W. Voshell, Boise, ID (US); Mirmajid Seyyedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/435,029

(22) Filed: May 12, 2003

(65) Prior Publication Data

US 2003/0202401 A1 Oct. 30, 2003

Related U.S. Application Data

(63) Continuation of application No. 09/941,646, filed on Aug. 30, 2001, now Pat. No. 6,574,137.

(51) Int. Cl.$^7$ ................................................ G11C 11/00
(52) U.S. Cl. ...................... 365/158; 365/171; 365/173; 365/230.06
(58) Field of Search .................................. 365/130, 158, 365/171, 173, 230.03, 230.06, 225.5

(56) References Cited

U.S. PATENT DOCUMENTS

| | | | |
|---|---|---|---|
| 6,191,972 B1 | 2/2001 | Miura et al. | |
| 6,256,224 B1 | 7/2001 | Perner et al. | |
| 6,272,041 B1 | 8/2001 | Naji | |
| 6,331,943 B1 * | 12/2001 | Naji et al. | 365/158 |
| 6,577,525 B2 * | 6/2003 | Baker | 365/158 |
| 6,594,176 B2 * | 7/2003 | Lammers | 365/171 |

* cited by examiner

*Primary Examiner*—Son Mai
(74) *Attorney, Agent, or Firm*—Dickstein Shapiro Morin & Oshinsky LLP

(57) ABSTRACT

A method and apparatus for selecting a rowline in a MRAM device. A rowline select circuit is provided on a first side of each rowline and connects the rowline to ground when a memory cell in the rowline is being written to and to a voltage source when a memory cell in the rowline is being read. A rowline stack select circuit is provided on the second side of each rowline and is connected to one rowline on each plane of memory. When a memory cell is being accessed, the rowline containing that memory cell as well as each other rowline connected to the same rowline stack select circuit are connected to a current source.

7 Claims, 4 Drawing Sheets

SINGLE ENDED ROW SELECT FOR A MRAM DEVICE

This application is a continuation of application Ser. No. 09/941,646, filed Aug. 30, 2001, now U.S. Pat. No. 6,574,137, the entire disclosure of which is incorporated herein by reference.

FIELD OF THE INVENTION

The present invention relates generally to magnetic memory devices, and, more particularly to a method and apparatus for selecting a rowline within a magnetic memory device.

BACKGROUND OF THE INVENTION

A typical MRAM device includes a plurality of planes of memory cells. Each plane of memory cells is divided into rowlines and bit lines. Rowlines, also termed word lines, extend along the rows of the memory cells and bit lines extend along the columns of the memory cells. A bit of information is stored as a resistance value at the intersection of a rowline and a column. The resistance value depends on the orientation of magnetization. The orientation of magnetization will be one of two stable orientations at a given time. These two orientations, parallel and anti-parallel, represent the logical values "1" and "0." The orientation of magnetization of a memory cell can be changed by supplying a current to the rowline and bitline intersecting at the selected memory cell. The currents create magnetic fields, that when combined, can switch the orientation of magnetization of a memory cell from parallel to anti-parallel or vice versa.

As shown in FIG. 1 an MRAM rowline select circuit may employ rowline select circuits 110 and 120 at each end of a rowline. When a memory cell on rowline 100 is accessed, each rowline select circuit 120 determines if that side of the rowline 100 should be connected to ground, voltage source 126 or left floating. This determination is made for each rowline 100, 220, 230 and 240. In addition, each rowline select circuit 110, one of which is connected to the other side of every rowline 100, 220, 230 and 240 in every plane, determines whether the other side of rowline 100 should be connected to current supply 116 or left floating.

Rowline select circuit 120 receives two addressing signals (Add1 and Add2), a WRITE signal and a plane select (PS) signal as inputs. The first addressing signal (Add1) is the output of an address decoding circuit which decodes a portion of the address of the desired rowline. For example, if each plane is broken up into groups of 16 rowlines, the four least significant bits of the address would be fed into the address decoding circuit who's output is the ADD1 signal. The remaining bits of the address are input into another address decoding circuit who's output is the ADD2 signal. If both the ADD1 and ADD2 signals indicate a match, then rowline 100 is the desired rowline. Alternatively, a single address decoding circuit can be used to decode the entire address and NOR gate 125 can be removed from circuit 120, however the approach described above uses wires more economically. The WRITE signal indicates whether the desired memory cell should be written to or read from. The plane select signal (PS) selects one of a plurality of planes of cells in a memory array.

In rowline select circuit 120 and 110, the ADD and ADD2 signals are active-low (e.g. when the input is a match, the address decoding circuits output a 0). If the address decoding circuits output active-high signals, the NOR gates 124, 125 and 115 and NAND gate 114 can be replaced with OR gates and an AND gate to achieve the same functionality.

The first addressing signal (ADD1) and the second addressing signal are input into NOR gate 125. The output of NOR gate 125 is coupled to the gate of transistor 123 which, when turned on, selectively couples transistor 121 to ground. The output of NOR gate 125 and the WRITE signal are input into NOR gate 124. The output of NOR gate 124 is coupled to the gate of transistor 122 which, when turned on, selectively couples voltage supply 126 to transistor 121. The plane select signal is coupled to the gate of transistor 121 which, when turned on, selectively couples rowline 100 to a node between transistors 122 and 123.

Rowline select circuit 110 also receives a WRITE signal, a first addressing signal (ADD1), a second addressing signal (ADD2) and a plane select (PS) signal as inputs. The first addressing signal (ADD1) and the Second addressing signal (ADD2) are input into NOR gate 115. The output of NOR gate 115 is input to NAND gate 114 along with the WRITE signal. The output of NAND gate 114 is input to inverter 113, the output of which is applied to the gate of transistor 112. Transistor 112, when turned on by an output signal from inverter 113, selectively connects current supply 116 to transistor 111. Transistor 111 selectively connects the current from current source 116 passing through transistor 112 to rowline 100 when the plane select signal (PS) is activated.

The various states of circuits 120 and 110 are illustrated in FIG. 4. The only important combinations of the first addressing signal (ADD1), the second addressing signal (ADD2), the WRITE signal, and the plane select (PS) signal are when the first addressing signal (ADD1), the second addressing signal (ADD2) and the plane select signal are all active and when the first addressing signal (ADD1), the second addressing signal (ADD2), the WRITE signal and plane select (PS) signal are all active. The remaining possible combinations either do not occur or are not significant to the operation of circuits 120 and 110.

When the first addressing signal (ADD1) and the second addressing signal (ADD2) are active and the WRITE signal is inactive, a read is taking place on rowline 100. When the first and second addressing signals are active (the signals are low), the state of the WRITE signal is inconsequential to circuit 120. When both addressing signals (ADD1 and ADD2) are active, NOR gate 125 will output a high signal. This output signal will activate transistor 123 (connecting rowline 100 to ground when the PS signal is active) as well as insure that NOR gate 124 outputs a low signal deactivating transistor 122. In addition, circuit 110 leaves the right side floating regardless of the plane select (PS) signal because during a read, the WRITE signal is low causing NAND gate 114 to output a high signal, NOT gate 113 to output a low signal and, as a result, transistor 112 is deactivated. This allows a circuit at the end of a column in the same plane as rowline 100 to determine the orientation of magnetization of a memory cell in rowline 100 based on the resistance.

When the first addressing signal (ADD1), the second address signal (ADD2), the WRITE signal and plane select (PS) signal are all active, a write is taking place on rowline 100. Circuit 120 connects the left side of rowline 100 to ground if the plane select (PS) signal is active and leaves the left side of rowline 100 floating if the plane select (PS) signal is inactive. When both addressing signals (ADD1 and ADD2) are active (the signals are low), NOR gate 125 outputs a high signal activating transistor 123 which connects rowline 100 to ground. In addition, NOR gate 115 outputs a high signal, which, in conjunction with an active WRITE signal, causes NAND gate 114 to output a low signal and NOT gate 113 to output a high signal. This activates transistor 112. Consequently, circuit 110 connects the right side of rowline 100 to current supply 116 if the plane select (PS) signal is active and leaves the right side of rowline 100 floating if the plane select signal is inactive. As a result, for a write to a selected rowline 100 in a selected plane, current flows across rowline 100. In conjunction with a current flowing in the column in the same plane as rowline 100, which may be a current for programming a zero or an opposite current for programming a one, the orientation of magnetization of the memory cell at the intersection of the selected row and column can be changed.

A MRAM device 300, as shown in FIG. 3, is typically connected over a bus to a processor 310. The bus can also connect other peripherals to processor 310, such as, for example, I/O devices 320 and hard drive 315. Processor 310 can then access MRAM device 300 to store data as described above.

Due to the relatively high current needed to program a cell, the transistors needed to switch the programming current are considerably larger than transistors used to switch logic signals and they take up more space.

A simplified rowline select circuit which draws less power and consumes less integrated circuit real estate would be desirable.

BRIEF SUMMARY OF THE INVENTION

The present invention mitigates the problems associated with the prior art and provides a unique method and system of selecting a row in a MRAM device on a single end.

In accordance with an exemplary embodiment of the present invention, the rowline select circuit on one side of each rowline is removed and replaced with a transistor connected to one rowline in each plane of memory cells. This transistor connects every rowline to which it is connected to a current supply when a memory cell in any rowline that it is connected to is being read from or written to. The present invention reduces the number of transistors required to activate a rowline, the power consumed by the rowline control circuits as well as the space that the rowline control circuits uses.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to make and use the invention, and it is to be understood that structural changes may be made and equivalent structures substituted for those shown without departing from the spirit and scope of the present invention.

Figure 2:
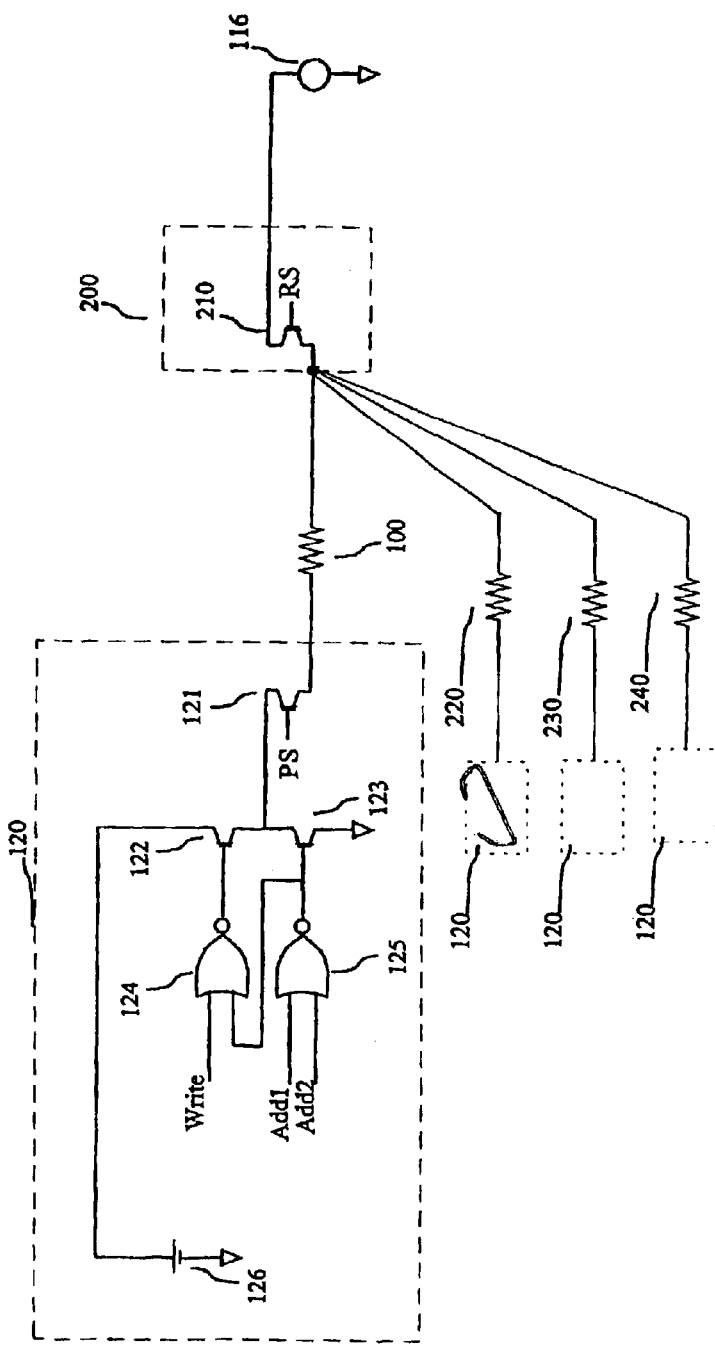
FIG. 2 is a block diagram of an exemplary embodiment of the present invention.
Figure 3:
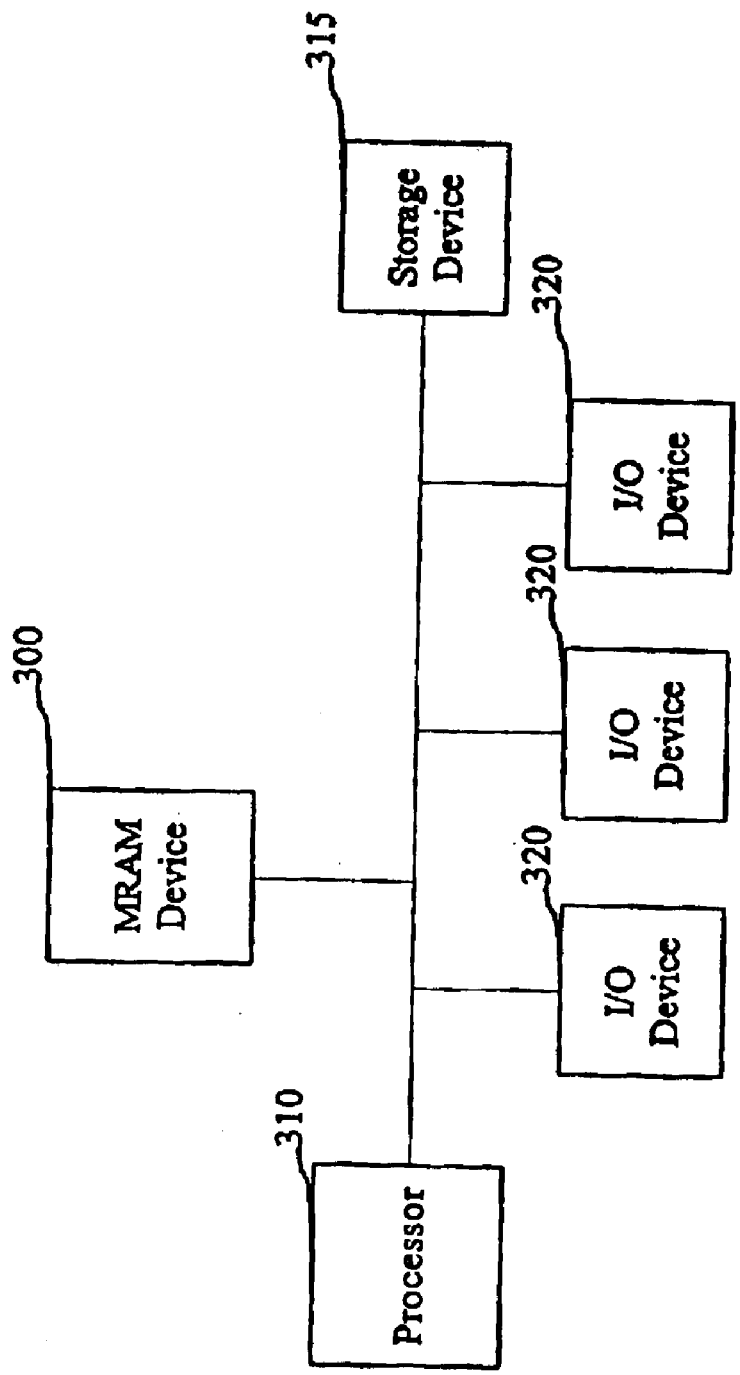
FIG. 3 is a processor circuit which utilizes a MRAM device constructed in accordance with the present invention.
Figure 4:
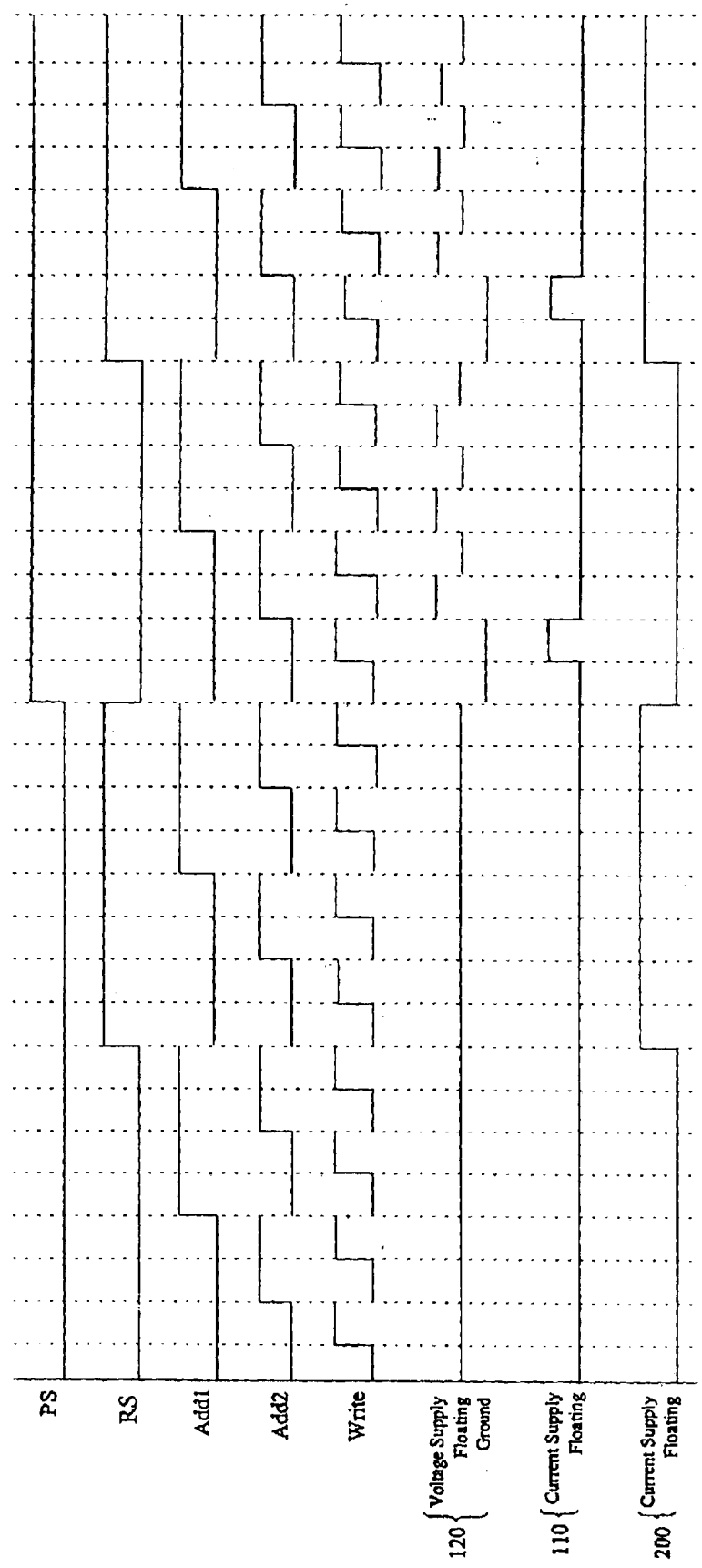
FIG. 4 is a timing diagram for a doubled ended row select for a MRAM device and for an exemplary embodiment of the present invention.

FIG. 2 shows an exemplary embodiment of the present invention. A stack of rowlines is illustrated in FIG. 2. Each rowline in the stack is part of a separate plane of memory cells. Each plane of memory cells is divided into rowlines and column lines.

Figure 1:
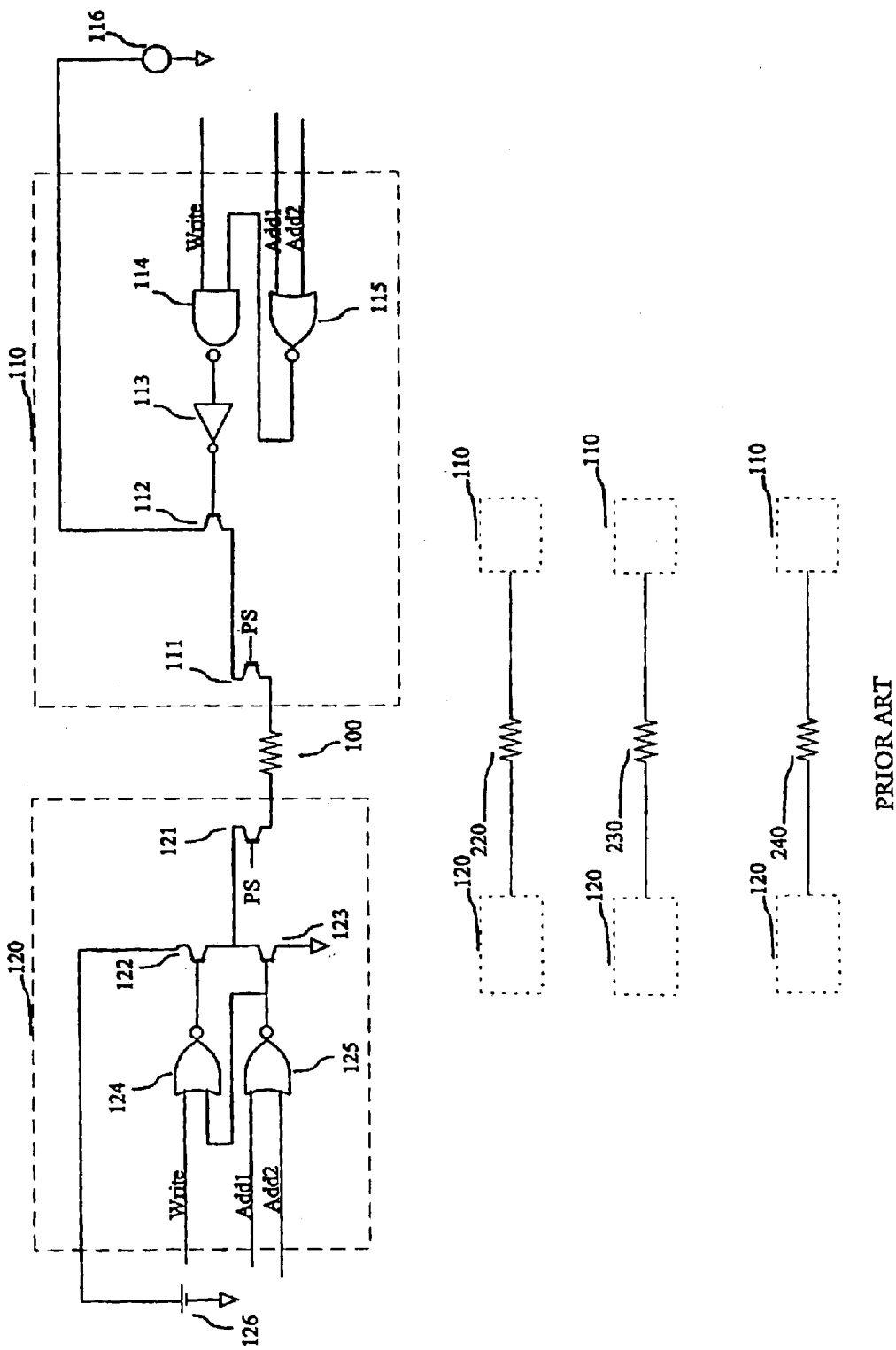
FIG. 1 is a block diagram of a double ended row select for a MRAM device.

FIG. 2 differs from FIG. 1 in that circuit 110 is replaced by circuit 200. As shown in FIG. 2, each stack of rowlines is coupled to a single transistor 210. For example, if a MRAM device has four planes, each plane has four rowlines and each rowline in each plane is numbered for its plane and rowline (e.g. P1R1 [for plane 1, rowline 1], P1R2, P1R3, P1R4, P2R1, P2R2, etc.) then P1R1, P2R1, P3R1 and P4R1 are a "stack" and would all be connected to one circuit 200. This reduces the number of transistors on one side of each rowline (circuit 110 has two transistors, a NOR gate, a NAND gate and a NOT gate while circuit 200 has only 1 transistor) as well as the total number of transistors on one side of a MRAM device; instead of connecting a separate circuit 110 to one side of each rowline, circuit 200 is connected to a stack of rowlines in different memory planes. In addition to circuit simplification, the performance of duplicate tasks on one side of a MRAM device is reduced for a selection operation.

Selection circuit 200 also differs from circuit 110 in that a rowline stack (RS) signal, which is active high, is applied to transistor 210 and used to select rowlines by stack. The rowline stack (RS) signal is the output of an address decoding circuit which indicates when a rowline 100 in a particular stack of rowlines is selected. As further illustrated in FIG. 2, transistor 210 is coupled to a current supply 116 and to a stack of rowlines 100, 220, 230 and 240. Transistor 210 selectively connects current supply 116 to stacked rowlines 100, 220, 230 and 240 when the rowline stack (RS) signal is active for stack selection.

Since circuit 120 selects a rowline 100 in the same plane as the desired rowline with a plane select (PS) signal and circuit 200 selects a rowline 100 in the same stack of rowlines as the desired rowline with a rowline stack (RS) signal, the only time both circuit 120 and circuit 200 will be active is when a particular rowline 100 in a plane and stack is addressed.

Although, circuit 200 connects the right side of a rowline 100 to current source 116 when the rowline stack (RS) signal is active, the same addressing capability for a selected rowline is retained for read and write operations by virtue of selection circuit 120.

While the invention has been described with reference to exemplary embodiments various additions, deletions, substitutions, or other modifications may be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method for forming a magnetic random access memory (MRAM) array, the method comprising:

forming at least a first rowline of a first plane of said MRAM array;

coupling a first side of said first rowline of said first plane to a first source/drain terminal of a transistor of a rowline select circuit of said MRAM array; and directly coupling a second source/drain terminal of said transistor to a current supply.

2. The method of claim 1 further comprising:

switchably coupling a second side of said first rowline of said first plane to a voltage source.

3. The method of claim 1 further comprising:

switchably coupling a second side of said first rowline of said first plane to ground.

4. The method of claim 1 further comprising:

forming a first rowline for each of a plurality of planes of said MRAM array; and coupling the first side of each of said first rowlines for each of said plurality of planes to said first source/drain terminal of said transistor of said rowline select circuit.

5. A method for forming a magnetic random access memory (MRAM) array, the method comprising:

forming a plurality of respective first rowlines of a corresponding plurality of planes of said MRAM array;

coupling a first side of each of said respective first rowlines to a first source/drain terminal of a transistor of a rowline select circuit;

coupling a second source drain terminal of said transistor to a current supply;

switchably coupling a second side of each of said respective first rowlines to a respective plurality of voltage terminals; and switchably coupling said second side of each of said respective first rowlines to a respective plurality of ground terminals.

6. A method for reading a memory cell of a magnetic random access memory (MRAM) array, the method comprising:

selecting a rowline of said MRAM array associated with said memory cell;

connecting a first side of said selected rowline to a voltage supply; and connecting a second side of a plurality of rowlines in a stack of rowlines residing in different planes of said MRAM array, including said selected rowline, to a current supply.

7. A method for writing to a memory cell of a magnetic random access memory (MRAM) array, the method comprising:

selecting a rowline of said MRAM array associated with said memory cell;

connecting a first side of said selected rowline to ground; and connecting a second side of a plurality of rowlines in a stack of rowlines residing in different planes of said MRAM array, including said selected rowline, to a current supply.

* * * * *